United States Patent
Lee et al.

(10) Patent No.: US 6,948,947 B2
(45) Date of Patent: Sep. 27, 2005

(54) SOCKET CONNECTOR FOR CARRYING INTEGRATED CIRCUIT PACKAGE

(75) Inventors: Genn-Sheng Lee, Tu-Chen (TW); Chao-Chung Cheng, Tu-Chen (TW); Wen-Yi Rai, Tu-Chen (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 11 days.

(21) Appl. No.: 10/929,125

(22) Filed: Aug. 27, 2004

(65) Prior Publication Data

US 2005/0142919 A1 Jun. 30, 2005

(30) Foreign Application Priority Data

Aug. 27, 2003 (TW) .............................. 92123531 A (51) Int. Cl.[7] .......................................... H01R 12/00
(52) U.S. Cl. ....................................... 439/73; 439/331
(58) Field of Search ................................... 439/73, 331

(56) References Cited

U.S. PATENT DOCUMENTS 6,648,656 B1 * 11/2003 Ma .............................. 439/73

* cited by examiner

*Primary Examiner*—Tho D. Ta
(74) *Attorney, Agent, or Firm*—Wei Te Chung (57) ABSTRACT

A socket connector for carrying an integrated circuit package includes an insulative housing, a stiffener surrounding the housing, a load plate pivotably assembled with one end of the stiffener and a load lever pivotally attached to the other end of the stiffener. The load plate defines a pair of pressing portions. Each of the pressing portions defines a wider part and a narrower part. During the rotation process of the load plate, the wider part firstly presses a pressing point of the IC package. A critical point, on which the wider part firstly presses, is ascertained that a distance from the critical point to a center of the IC package is approximately 5/24 of the entire length along the same direction. The pressing point is within a range from the critical point to the center of the IC package.

19 Claims, 6 Drawing Sheets

SOCKET CONNECTOR FOR CARRYING INTEGRATED CIRCUIT PACKAGE

BACKGROUND OF THE INVENTION

1. Field of the Invention

The present invention relates to a socket connector for electrically connecting an integrated circuit package to a printed circuit board, especially to a land grid array socket connector.

2. Description of the Prior Art

Modern computer systems increase in performance and complexity at a very rapid pace, driven by intense competition and market demands. In order to meet ever-increasing performance requirements, the area and volumetric interconnect densities of electronic board assemblies must increase accordingly. In combination with other competitive forces, this demand has driven the need for improved high-density socket technologies in computer applications, and the connector industry has responded with a variety of new alternatives to meet these needs. One of the most attractive of the new connector types is the land grid array (LGA) socket connector, which permits direct electrical connection between an LGA integrated circuit and a printed circuit board. LGA socket connectors are an evolving technology in which an interconnection between mating surfaces of an IC or other area array device and a printed circuit board is provided through a conductive terminal received in the socket connector. Connection is achieved by mechanically compressing the IC onto the socket connector.

Figure 7:
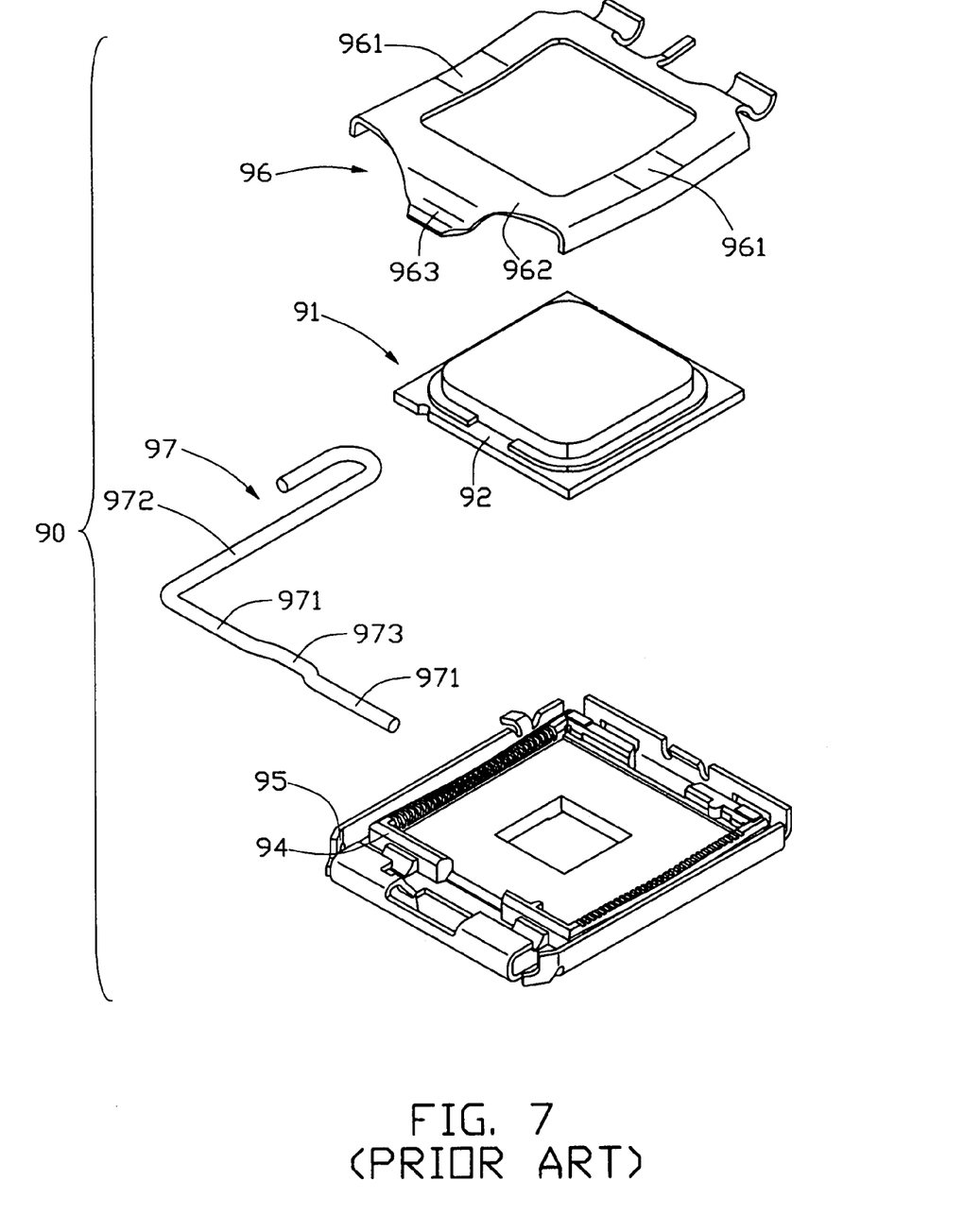
FIG. 7 is an exploded isometric view of a conventional socket connector.

FIG. 7 discloses a conventional socket connector 90 for electrically connecting an integrated circuit (IC) package 91 to a printed circuit board (PCB, not shown). The conventional socket connector 90 comprises a plurality of conductive terminals (not shown) received in an insulative housing 94, a stiffener 95 surrounding the housing 94, a load plate 96 pivotably assembled with one end of the stiffener 95 and a load lever 97 pivotably attached to the other end of the stiffener 95.

The load plate 96 defines a pair of parallel slightly sunken pressing portions 961 and a crossbeam 962 connecting the two pressing portions 961. Each of the pressing portions 961 has an even width along a direction perpendicular to the crossbeam 962. The crossbeam 962 defines a holding portion 963 protruding therefrom.

The load lever 97 includes a pivotal section 971 and an actuating section 972 substantially perpendicular to the pivotal section 971. The pivotal section 971 defines a suppressing portion 973 extending from a middle portion thereof.

After the IC package 91 is placed in the housing 94, the load plate 96 is actuated to rotate toward the pivotal section 971 of the load lever 97, and the suppressing portion 973 is actuated by the actuating section 972 to press on the holding portion 963. Finally, the pressing portions 961 are pressed on a frame 92 of the IC package 91, which restricts the IC package 91 in the housing 94 for achieving reliable mechanical and electrical connection between the IC package 91 and the connector 90.

However, during the rotation process of the load plate 96, the pressing portions 961 firstly press on the marginal part of the frame 92 of the IC package 91, and gradually press on the middle part of the frame 92. While the pressing portions 961 press on the marginal part of the frame 92, the pressing force will tilt the IC package rotatably about the pressing point. Along with the rotation process of the load plate, the pressing portions press on the middle part of the frame 92, and the IC package is pressed down, which makes it easy for the IC package to slide relative to the housing 94 and scrape on the housing 94. And as a result, the IC package 91 cannot align with the terminals received in the housing 94, and the housing 94 is abraded.

Hence, a new socket connector which overcomes the above-described disadvantages is desired.

SUMMARY OF THE INVENTION

Accordingly, a primary object of the present invention is to provide a socket connector which can avoid an IC package mounted thereon scraping on a housing of the connector.

In order to achieve the abovementioned object, a socket connector in accordance with a preferred embodiment of the present invention is used to electrically connect an integrated circuit (IC) package to a printed circuit board (PCB). The socket connector comprises a plurality of conductive terminals received in an insulative housing, a stiffener surrounding the housing, a load plate pivotably assembled with one end of the stiffener and a load lever pivotably attached to the other end of the stiffener. The terminals are arranged within a substantially quadrate array, and the array defines a vacant area in middle portion thereof. The load plate defines a pair of pressing portions. Each of the pressing portions defines a wider part and a narrower part. During the rotation process of the load plate, the wider part firstly presses on a pressing point of the IC package. In order not to tilt the IC package, a critical point, on which the wider part firstly presses, is ascertained that a distance from the critical point to a center of the IC package along a direction parallel to the pressing portion is approximately 5/24 of the entire length along the same direction. The pressing point is within a range from the critical point to the center of the IC package. Thus, during the rotation process of the load plate, the IC package cannot be rotatably tilted.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
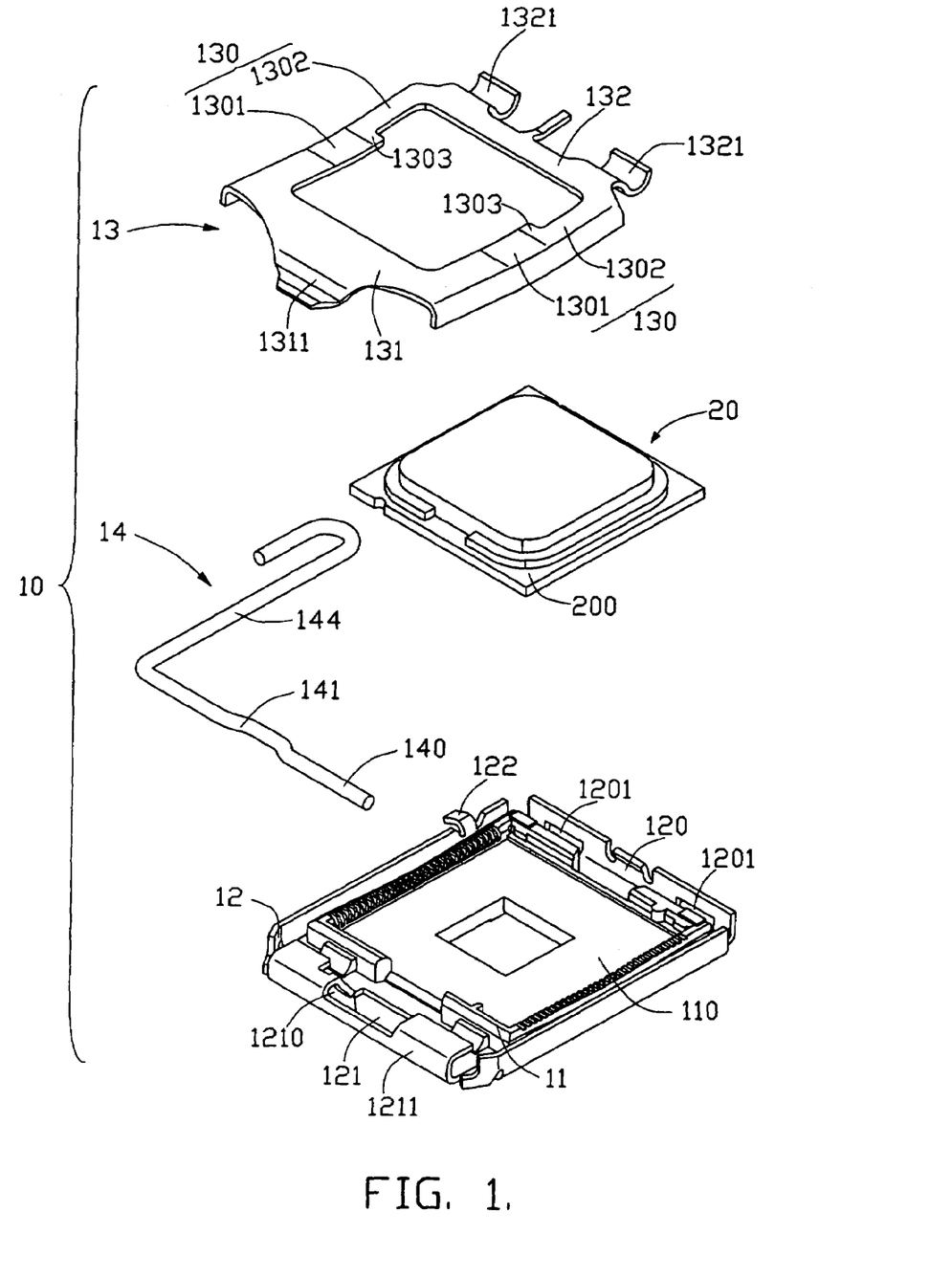
FIG. 1 is an exploded isometric view of a socket connector in accordance with a preferred embodiment of the present invention, shown with an integrated circuit package ready to be mounted onto the connector.
Figure 2:
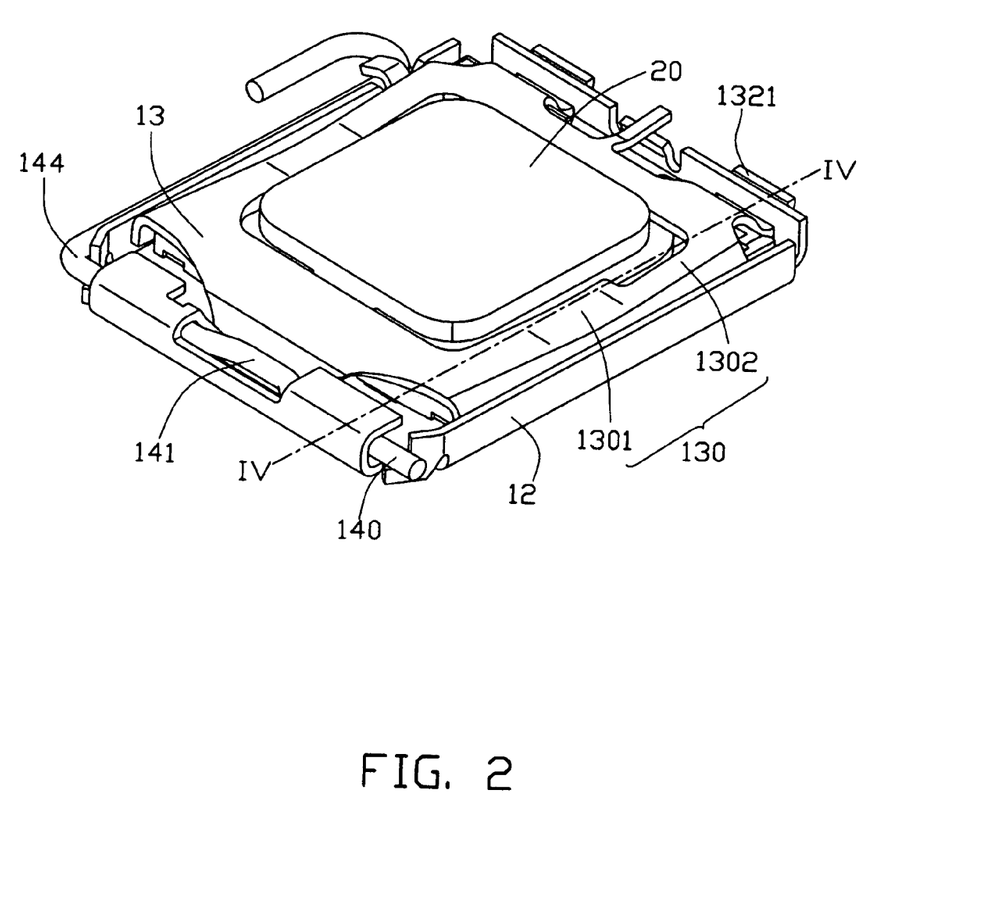
FIG. 2 is an assembled view of the socket connector of FIG. 1, shown with the IC package mounted on the connector.
Figure 3:
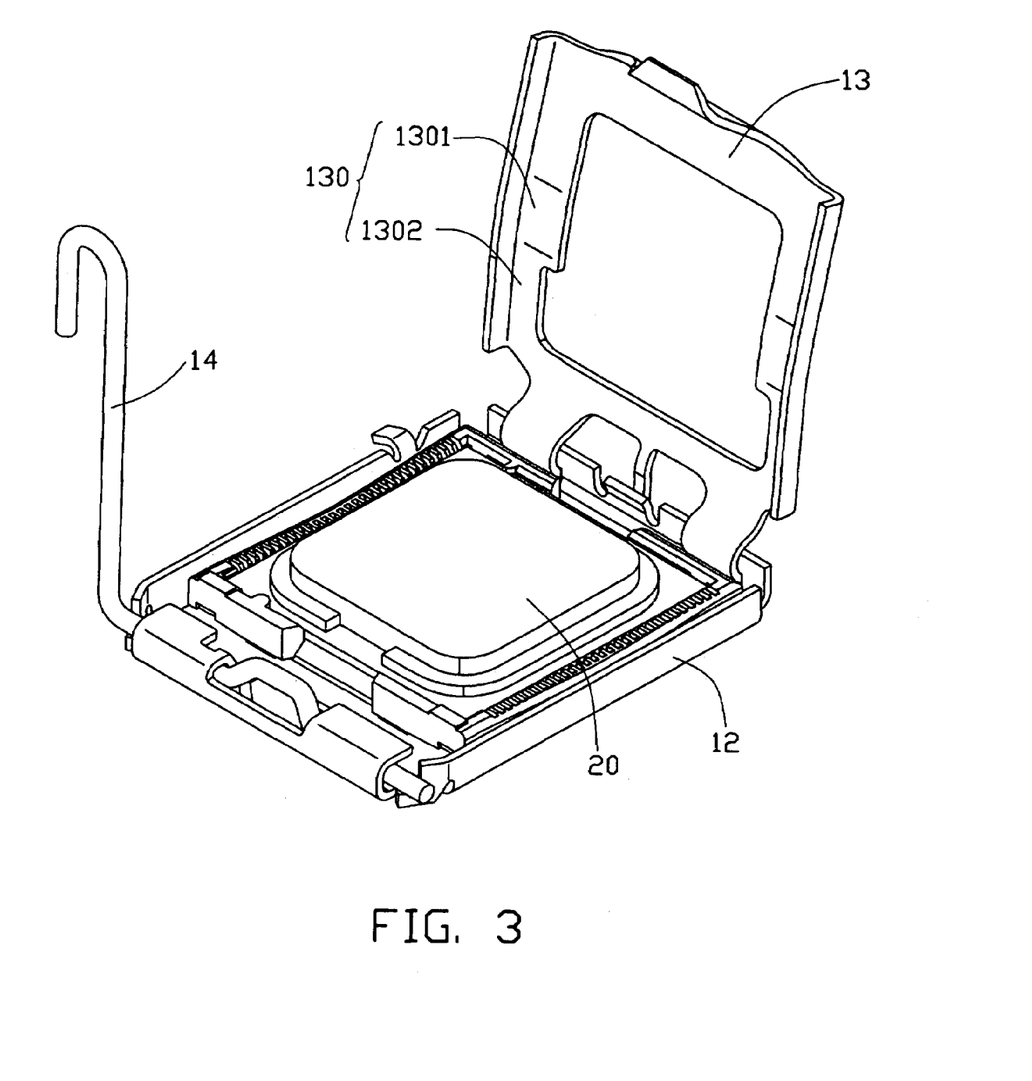
FIG. 3 is similar to FIG. 2, but showing the connector open.
Figure 4:
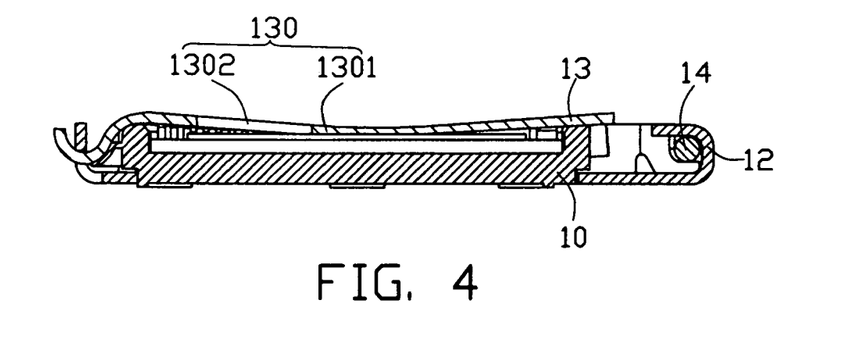
FIG. 4 is a cross-section view taken along line IV—IV of FIG. 2.

Referring to FIG. 1, a socket connector 10 in accordance with a preferred embodiment of the present invention is used for electrically connecting an integrated circuit (IC) package 20 to a printed circuit board (PCB) (not shown). The socket connector 10 comprises an insulative housing 11 accommodating a plurality of arrayed terminals (not shown) therein, a stiffener 12 surrounding the housing 11, a load plate 13 assembled with the stiffener 12, and a load lever 14 opposite to the load plate 13. Referring to FIG. 7, which is a simplified illustration of the arrangement of arrayed terminals of the socket connector, the terminals are arranged within a substantially quadrate array. Said array defines a vacant area in middle portion thereof.

The housing 11 defines a recessed area 110 for receiving the IC package 20 therein. The stiffener 12 includes a first end 120 defining a pair of spaced pivotal opening 1201, and a second end 121 defining a pivotal slot 1210 and a receiving slot 1211. The stiffener 12 further defines a restricting block 122 at a sidewall thereof.

The load plate 13 includes a pair of pressing portions 130, a first connecting beam 131 linking the two pressing portions 130 at one end, and a second connecting beam 132 linking the two pressing portions 130 at the other end. Each pressing portion 130 being of a downwardly curved plate-like configuration, defines a wider part 1301 and a narrower part 1302 connecting with the wider part 1301, and a contacting point 1303 is formed accordingly. The first connecting beam 131 defines a holding portion 1311 protruding therefrom, and the second connecting beam 132 defines a pair of spaced pivotal segments 1321.

The load lever 14 comprises a pivotal section 140 defining a suppressing section 141 rising from the pivotal section 140, and an actuating section 144 substantially perpendicular to the pivotal section 140.

Referring to FIGS. 1–4, after the above described components are assembled together, the load plate 13 is assembled to the first end 120 of the stiffener 12 with the pivotal segments 1321 cooperating with the pivotal openings 1201, and the load lever 14 is assembled to the second end 121 of the stiffener 12 with the pivotal section 140 being received in the pivotal slot 1210. Therefore, the load plate 13 and the load lever 14 can rotate relative to the stiffener 13, and the suppressing section 141 can move in the receiving slot 1211. When the socket connector 10 is closed, the pressing portions 130 press on a frame 200 of the IC package 20. The suppressing section 141 of the load lever 14 acts on the holding portion 1311 of the load plate 13, and finally the actuating section 144 is restricted by the restricting block 122. Thus, the IC package 20 is positioned and restricted in place reliably and firmly.

During the movement of the load plate 13 toward the pressing section 141, the contacting point 1303 of the pressing portion 130 firstly presses on the frame 200 of the IC package 20. In order to ensure that the IC package 20 will not be tilted by the load plate 13 when the contacting point 1303 presses on the frame 200 of the IC package 20, the contacting point 1303 should be generally defined on middle sect of the pressing portion 130. Critically, the position of the contacting point 1303 must be restricted within a certain range.

Figure 5:
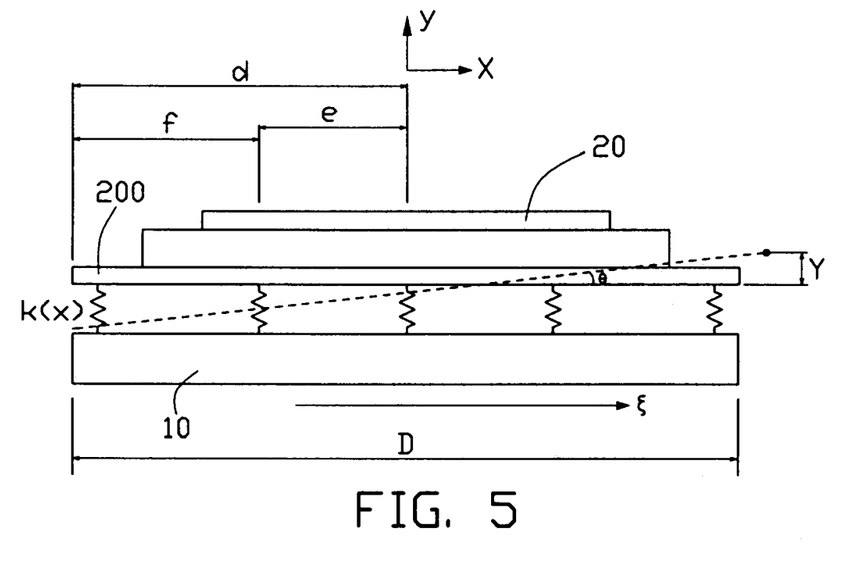
FIG. 5 is a simplified illustration of the IC package mounted on the socket connector.

FIG. 5 is a simplified illustration of the IC package 20 mounted on the socket connector 10. The IC package 20 is floatably supported by the terminals (not labeled). An entire longitudinal length of the IC package 20 is designated as dimension "D", and a half of the length is designated as dimension "d", i.e., D=2d. A distance from the pressing portion, where the contacting point 1303 presses on, to a center of the IC package 20 along a direction parallel to the longitudinal direction is designated as demission "e", and a distance from the pressing portion and the edge of the frame is designated as demission "f", i.e., d=e+f. A ratio "N" is defined as: N=e/D. It is now supposed that the IC package 20 is tilted upwardly when the load plate 13 presses on the IC package 20. A vertical displacement is accordingly occurred, and the displacement is designated as dimension "Y". In fact, the tilting process is a rotating one, and an angle is accordingly defined as "θ". The elastic-coefficient of each of the terminals is defined as "k". An experiential formula is attached below:

$$K_\Delta = 2\left(\int_0^{d/2} \frac{1}{3}kd\xi + \int_{\frac{d}{2}}^d \frac{2}{3}kd\xi\right)[\circ],$$

wherein:
$K_\Delta$ is the total distributed elastic-coefficient;
$\xi$ is a variable along the longitudinal direction.

Another experiential formula is attached below:

$$k_\theta \theta = 2\left(\int_0^{d/2} \frac{1}{3}k\theta\xi^2 d\xi + \int_{\frac{d}{2}}^d \frac{2}{3}k\theta\xi^2 d\xi\right)[\circ],$$

wherein
$k_\theta \theta$ is the torque, by which the IC package 20 is tilted.

We can draw a conclusion by referring to FIG. 5: Y=tgθd−Δ, wherein Δ is a tiny displacement of the center of the IC package 20. Because the angle θ is so tiny, so tgθ is substantially equal to θ. Therefore, $$Y=\theta d-\Delta [\circ].$$

Integrating all the formulas listed above, we can get a equation:

$$Y = \frac{p}{kd}\left(\frac{12e}{5d} - 1\right).$$

It is clear that Y will be equal to zero if e is equal to 5d/12. In this case, N is equal to 5/24. Thus, the IC package 20 will not be tilted when the load plate 13 presses on such a point that the distance from this point two the center of the IC package 20 is equal to 5/24 of the entire length of the IC package 20. It is noted that this point is a critical point. If the contacting point 1303 presses on a position of the frame 20 that makes N more than 5/24, the IC package will be tilted. If the contacting point 1024 presses on a position of the frame 20 that makes N less than 5/24, the IC package will be tilted inverted, but the inverted tilt can not make the IC package scrape on the housing 11. And therefore, as long as the contacting point 1303 is within a range form the critical point to the center of the IC package 20, the IC package 20 will not scrape on the housing 11.

Figure 6:
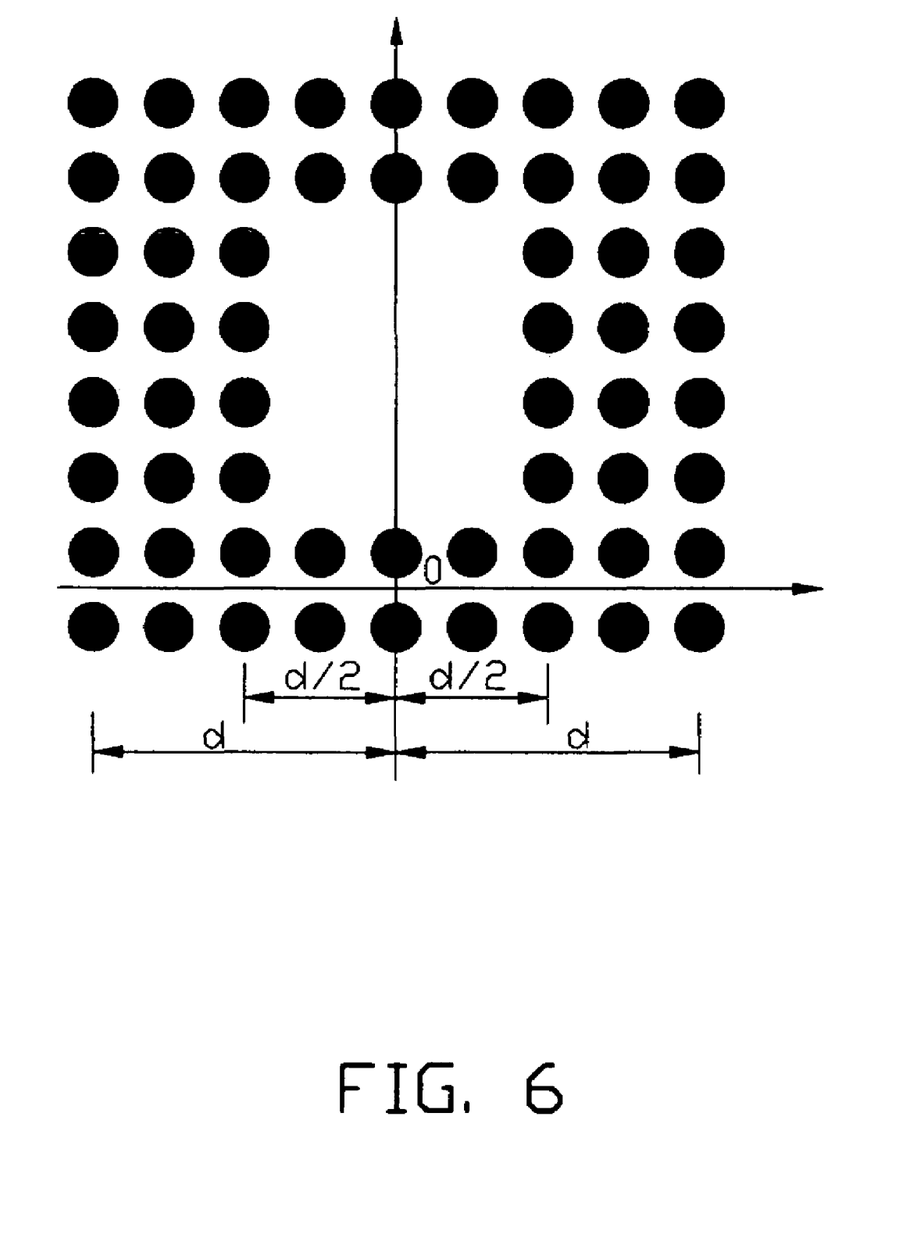
FIG. 6 is a simplified illustration of the arrangement of arrayed terminals of the socket connector.

It must be noted that all the above-listed experiential formulas are based on the array of the terminals shown in FIG. 6. In other words, different terminal arrangements will result in different formulas based upon the same principle/theory.

While the present invention has been described with reference to specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. A socket connector for electrically connecting an integrated circuit package to a printed circuit board comprising:
   an insulative housing holding a plurality of conductive terminals therein;
   a stiffener surrounding the housing;
   a load plate pivotably assembled with one end of the stiffener;
   a load lever moveably assembled with the other end of the stiffener to hold said load plate in position; wherein
   the load plate defines a pair of pressing portions, and each of the pressing portions defines a protruding contacting point firstly pressing on the integrated circuit package when the load plate is pressed down toward the load lever; wherein
   the contacting point is defined in a middle section of the pressing portion; wherein
   each of said pressing portions includes a narrower part and a wider part, and the wider part defines said contacting point which is located around a distal end of the narrower part.

2. The socket connector as described in claim 1, wherein the pressing portion is of a downwardly curved plate-like configuration.

3. The socket connector as described in claim 1, wherein the terminals are arranged within a substantially quadrate array defining a vacant area in the middle portion thereof.

4. The socket connector as described in claim 2, wherein the contacting point is defined on such a position that a distance from the contacting point to a center of the integrated circuit package along a longitudinal direction is substantially $5/24$ of the entire length of the integrated circuit package when the load plate presses on the integrated circuit package.

5. A socket connector, for carrying an integrated circuit package, comprising:
   an insulative housing;
   a plurality of conductive terminals received in the housing;
   a stiffener assembled with the housing;
   a load plate defining a pair of pressing portions;
   a load lever cooperating with the load plate for restricting the integrated circuit package in the connector; wherein
   each of the pressing portions defines a wider part and narrower part, and the wider part firstly presses on the integrated circuit package during movement of the load plate toward the load lever, and the wider part defines a contacting point around a distal end of the narrower part.

6. The socket connector as described in claim 5, wherein the pressing portion is of a downwardly curved plate-like configuration.

7. The socket connector as described in claim 5, wherein the terminals are arranged within a substantially quadrate array defining a vacant area in middle portion thereof.

8. The socket connector as described in claim 7, wherein a distance from a distal end of the narrower part connecting with the wider part to a center of the integrated circuit package is substantially $5/24$ of an entire length of the integrated circuit package.

9. An electrical connector assembly comprising:
   an insulative housing defining a recessed area;
   a plurality of conductive terminals accommodated in the housing;
   a stiffener assembled with the housing, the stiffener defining a first end and a second end;
   a load plate pivotably assembled with the first end of the stiffener, the load plate defining a pair of pressing portions;
   a load lever moveably assembled with the second end of the stiffener;
   an integrated circuit package received in the recessed area of the housing, the integrated circuit package defining an entire length along a longitudinal direction; wherein
   each of the pressing portions defines a wider part and a narrower part, and the wider part defines a contacting point around a distal end of the narrower part, said contacting point firstly presses on the integrated circuit package.

10. The electrical connector assembly as described in claim 9, wherein a distance from the contacting point to a center of the integrated circuit package is substantially $5/24$ of the entire length of the integrated circuit package.

11. The electrical connector assembly as described in claim 9, wherein said narrower part is closer to a pivotal end of said load plate, and said wider part is farther from said pivotal end of said load plate.

12. The socket connector as described in claim 9, wherein the pressing portion is of a downwardly curved plate-like configuration.

13. The electrical connector assembly comprising:
   an insulative housing defining opposite first and second ends, along a lengthwise direction, with a recessed area therebetween;
   a plurality of conductive terminals accommodated in the housing in matrix;
   a load plate pivotably assembled around the first end of the housing, the load plate defining at least one pressing portion;
   a load lever moveably assembled around the second end of the housing; and
   an integrated circuit package essentially snugly received in the recessed area of the housing in said lengthwise direction; wherein
   the pressing portion defines an initial contacting point to engage a position of the integrated circuit package, and said position is essentially located within a range along said lengthwise direction between a center point of integrated circuit package and a specific critical point spatially located between said center point and the first end with a critical distance spaced from the center point under a condition that during securely holding the integrated circuit package in the housing via tensional engagement between the integrated circuit package and said load plate, said critical point will not result in an upward movement of an edge of said integrated circuit package around the second end with regard to an original vertical position of the integrated circuit package prior to engagement with the load plate wherein said critical point is determined by an arrangement of said terminals; wherein
   the pressing portion is of a downwardly curved plate-like configuration and including a wider part and a narrower part, said initial contacting point being formed on the wider part.

14. The electrical connector assembly as described in claim 13, wherein the terminals are arranged within a substantially quadrate array defining a vacant area in middle portion thereof.

15. The electrical connector assembly as described in claim 14, where in said load level is pivotally attached around the second end of the housing.

16. The electrical connector assembly as described in claim 14, wherein the larger the vacant area is, the smaller the critical distance is.

17. The electrical connector assembly as described in claim 16, wherein the distance is substantially 5/24 of an entire length of the integrated circuit package.

18. The electrical connector assembly as described in claim 14, wherein a stiffener is assembled to the housing.

19. The electrical connector assembly as described in claim 18, wherein at least one of said load plate and said load level is assembled to said stiffener.

* * * * *